United States Patent
Koo et al.

(10) Patent No.: US 8,890,317 B1
(45) Date of Patent: Nov. 18, 2014

(54) ORGANIC LIGHT EMITTING DISPLAY DEVICE AND MANUFACTURING METHOD THEREOF

(71) Applicant: Samsung Display Co., Ltd., Yongin, Gyeonggi-Do (KR)

(72) Inventors: Young-Mo Koo, Yongin (KR); Ok-Keun Song, Yongin (KR); Min-Woo Lee, Yongin (KR); Jae-Goo Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/037,710

(22) Filed: Sep. 26, 2013

(30) Foreign Application Priority Data

May 22, 2013 (KR) .................. 10-2013-0057818

(51) Int. Cl.
*H01L 51/52* (2006.01)
*H01L 27/32* (2006.01)
*H01L 51/56* (2006.01)

(52) U.S. Cl.
CPC .............. *H01L 27/326* (2013.01); *H01L 51/56* (2013.01); *H01L 27/3246* (2013.01); *H01L 51/5212* (2013.01); *H01L 51/5209* (2013.01)
USPC .......................................... 257/739; 257/40

(58) Field of Classification Search
CPC .............. H01L 27/3246; H01L 27/326; H01L 51/5209; H01L 51/5212
USPC ...................................... 257/40, 739, E27.12
See application file for complete search history.

(56) References Cited

U.S. PATENT DOCUMENTS

| | | | |
|---|---|---|---|
| 7,286,108 B2 * | 10/2007 | Tsuda et al. | 345/92 |
| 7,486,360 B2 * | 2/2009 | Kim | 349/114 |
| 7,547,920 B2 * | 6/2009 | Lee et al. | 257/79 |
| 8,039,841 B2 * | 10/2011 | Park | 257/59 |
| 2010/0019660 A1 | 1/2010 | Lee et al. | |
| 2010/0025664 A1 * | 2/2010 | Park | 257/40 |
| 2010/0052518 A1 * | 3/2010 | Jeon et al. | 313/504 |
| 2012/0228592 A1 | 9/2012 | Yokoyama et al. | |
| 2013/0001603 A1 * | 1/2013 | Lim et al. | 257/88 |

FOREIGN PATENT DOCUMENTS

| | | |
|---|---|---|
| JP | 2012 209251 A | 10/2012 |
| KR | 10-2007-0070592 A | 7/2007 |
| KR | 10-2010-0010750 A | 2/2010 |
| KR | 10-2011-0138787 A | 12/2011 |

\* cited by examiner

*Primary Examiner* — Allan R Wilson
(74) *Attorney, Agent, or Firm* — Lee & Morse, P.C.

(57) ABSTRACT

An organic light emitting display device includes a first electrode on a substrate, an auxiliary electrode on the substrate, the auxiliary electrode being spaced apart from the first electrode, a protrusion on the auxiliary electrode, a pixel defining layer overlapping end portions of the first electrode and of the auxiliary electrode, the pixel defining layer separating the first electrode from the auxiliary electrode, an organic layer on the first electrode, and a second electrode on the organic layer, the protrusion electrically connecting the second electrode to the auxiliary electrode.

16 Claims, 6 Drawing Sheets

ORGANIC LIGHT EMITTING DISPLAY DEVICE AND MANUFACTURING METHOD THEREOF

CROSS-REFERENCE TO RELATED APPLICATION

This application claims priority under 35 U.S.C. §119 to Korean Patent Application No. 10-2013-0057818, filed on May 22, 2013, with the Korean Intellectual Property Office, the disclosure of which is incorporated herein in its entirety by reference.

BACKGROUND

1. Field

The present disclosure relates to an organic light emitting display device and a manufacturing method thereof, and more particularly, to a top-emission type organic light emitting display device and a manufacturing method thereof.

2. Description of the Related Art

An organic light emitting display device is a self-emission display device, which has an organic light emitting diode that emits light to display an image. Since the organic light emitting display device does not require a separate light source, e.g., unlike a liquid crystal display, it is possible to reduce relative thickness and weight thereof. Further, the organic light emitting display device is in the spotlight as an advanced display device by virtue of other features, e.g., low power consumption, high luminance, rapid response speed, and the like.

A conventional organic light emitting diode may include a hole injection electrode, an organic light emitting layer, and an electron injection electrode. A hole injected from the hole injection electrode and an electron injected from the electron injection electrode combine with each other in the organic light emitting layer to form an exciton, and light is emitted by energy that is generated when the exciton falls to the ground state.

The organic light emitting display device using such an organic light emitting diode may be classified into a top emission type and a bottom emission type, in accordance with a direction in which the generated light is emitted from the organic light emitting layer to the outside (output). That is, the bottom emission organic light emitting display device outputs light in a direction of the hole injection electrode by using a transparent hole injection electrode and a reflective electron injection electrode. The top emission organic light emitting display device outputs light in a direction of the electron injection electrode by using a reflective hole injection electrode and a transflective (semi-transmissive) electron injection electrode.

SUMMARY

The present disclosure has been made in an effort to provide a top emission organic light emitting display device with a transmissive electron injection electrode, such that a predetermined voltage may be applied to the electron injection electrode by reducing sheet resistance of the electron injection electrode.

An embodiment of the present disclosure provides an organic light emitting display device, including a first electrode on a substrate, an auxiliary electrode on the substrate, the auxiliary electrode being spaced apart from the first electrode, a protrusion on the auxiliary electrode, a pixel defining layer overlapping end portions of the first electrode and of the auxiliary electrode, the pixel defining layer separating the first electrode from the auxiliary electrode, an organic layer on the first electrode and separated by the pixel defining layer, and a second electrode on the organic layer, the protrusion electrically connecting the second electrode to the auxiliary electrode.

The auxiliary electrode may be between adjacent first electrodes.

The auxiliary electrode may have a strip pattern extending in a first direction.

The organic light emitting display device may further include an additional auxiliary electrode having a strip pattern extending in a second direction intersecting the first direction.

The organic layer may overlap the auxiliary electrode, a height of the protrusion on the auxiliary electrode being greater than a thickness of the organic layer on the auxiliary electrode.

The protrusion may have a shape of a cone, a cylinder, a pyramid, and/or a prism.

The protrusion may be conductive.

The protrusion may include at least one of indium tin oxide (ITO), gold (Au), silver (Ag), copper (Cu), aluminum (Al), molybdenum (Mo), tungsten (W), zinc oxide, tin oxide, indium oxide, and gallium oxide.

The organic layer may include an organic light emitting layer.

The organic light emitting layer may include a red light emitting layer, a green light emitting layer, and/or a blue light emitting layer.

The organic light emitting layer may further include a white light emitting layer.

The organic light emitting display device may further include a hole transport layer and a hole injection layer between the first electrode and the organic light emitting layer.

The organic light emitting display device may further include an electron transport layer and an electron injection layer between the organic light emitting layer and the second electrode.

An embodiment of the present disclosure also provides a manufacturing method of an organic light emitting display device, the method including forming a first electrode and an auxiliary electrode on a substrate, the auxiliary electrode being spaced apart from the first electrode, forming a protrusion on the auxiliary electrode, forming a pixel defining layer overlapping end portions of the first electrode and of the auxiliary electrode, the pixel defining layer separating the first electrode from the auxiliary electrode, forming an organic layer on the first electrode and separated by the pixel defining layer, and forming a second electrode on the organic layer, the protrusion electrically connecting the second electrode to the auxiliary electrode.

Forming the protrusion on the auxiliary electrode may include forming a protrusion-forming material on the substrate, on which the first electrode and the auxiliary electrode are formed, and patterning the protrusion-forming material, such that the protrusion are only on the auxiliary electrode.

Forming the protrusion-forming material may include a sputtering process or a chemical vapor deposition (CVD) process.

DETAILED DESCRIPTION

Hereinafter, embodiments will be described in detail with reference to the accompanying drawings. However, the scope of the embodiments is not limited to the following description or the drawings. The accompanying drawings are only for illustration of embodiments selected from among the various embodiments of the present disclosure, and thus, should not limit the scope of the embodiments.

In the drawings, certain elements or shapes may be simplified or exaggerated to better illustrate the disclosure, and other elements present in an actual product may also be omitted. Thus, the drawings are intended to facilitate the understanding of the disclosure.

Throughout the disclosure, like reference numerals refer to like elements throughout the various figures and embodiments. In addition, when a layer or element is referred to as being "on" another layer or element, the layer or element may be directly on the other layer or element, or one or more intervening layers or elements may be interposed therebetween.

Figure 1:
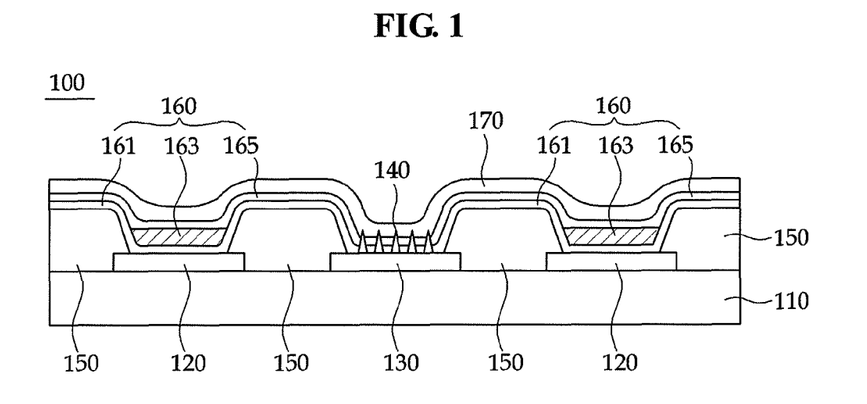
FIG. 1 is a cross-sectional view illustrating an organic light emitting display device according to an embodiment of the present disclosure.

FIG. 1 is a cross-sectional view illustrating an organic light emitting display device according to an embodiment of the present disclosure.

Referring to FIG. 1, an organic light emitting display device 100 according to an embodiment of the present disclosure may include a substrate 110, a plurality of first electrodes 120 on the substrate 110, an auxiliary electrode 130 formed on the substrate 110 and spaced apart from the first electrode 120, a protrusion 140 on the auxiliary electrode 130, a pixel defining layer 150 overlapping end portions of the first electrode 120 and the auxiliary electrode 130 and separating the first electrode 120 from the auxiliary electrode 130, an organic layer 160 on the substrate 110 on which the first electrode 120, the auxiliary electrode 130, and the pixel defining layer 150 are formed, and a second electrode 170 on the organic layer 160.

As illustrated in FIG. 1, in the organic light emitting display device 100 according to an embodiment of the present disclosure, the auxiliary electrode 130 may be provided between two adjacent first electrodes 120. For example, with respect to the auxiliary electrode 130 according to an embodiment of the present disclosure, one auxiliary electrode 130 may be provided for a single first electrode 120. In another example, with respect to the auxiliary electrode 130 according to another embodiment of the present disclosure, one auxiliary electrode 130 may be provided for more than two first electrodes 120. A configuration of the auxiliary electrode 130 will be described below in detail.

Further, a height of the protrusion 140 on the auxiliary electrode 130 has a higher value than a thickness of the organic layer 160 on the auxiliary electrode 130. Therefore, the auxiliary electrode 130 and the second electrode 170 may be electrically connected to each other by the protrusion 140.

A transparent insulating substrate may be used as the substrate 110. For example, the substrate 110 may be formed of a glass substrate, a quartz substrate, a transparent resin substrate, and the like. The transparent resin substrate which may be used as the substrate 110 may include, e.g., a polyimide resin, an acrylic resin, a polyacrylate resin, a polycarbonate resin, a polyether resin, a polyethylene terephthalate resin, a sulfonic acid resin, and the like, which may be used alone or in combination with each other. The substrate 110 may be selected by a person skilled in the art as necessary.

Although not illustrated in FIG. 1, a thin film transistor layer (not shown), which is electrically connected to the first electrode 120, may be provided on the substrate 110. A semiconductor device including a gate electrode, a source electrode, and a drain electrode may be provided on the thin film transistor layer. The drain electrode may be electrically connected to the first electrode 120. An insulating layer (not shown) having a thickness, which may be sufficient to cover the semiconductor device, may be provided on the thin film transistor layer.

The first electrode 120 may be provided on the substrate 110. A reflective electrode may be provided as the first electrode 120 in the organic light emitting display device 100 according to an embodiment of the present disclosure. The reflective electrode may include a metal, e.g., gold (Au), platinum (Pt), silver (Ag), aluminum (Al), nickel (Ni), tungsten (W), chromium (Cr), molybdenum (Mo), iron (Fe), cobalt (Co), copper (Cu), palladium (Pd), titanium (Ti), and a compound thereof, which may be used alone or in combination with each other. Further, the first electrode 120 may be provided in a single layer structure or a multilayer structure, which includes the above-mentioned metals and/or a compound thereof.

The auxiliary electrode 130, which is spaced apart from the first electrode 120, may be provided on the substrate 110. The auxiliary electrode 130 may be formed of a conductive material. The conductive material may include a metal, e.g., gold (Au), platinum (Pt), silver (Ag), aluminum (Al), nickel (Ni), tungsten (W), chromium (Cr), molybdenum (Mo), iron (Fe), cobalt (Co), copper (Cu), palladium (Pd), titanium (Ti), and a compound thereof, which may be used alone or in combination with each other.

Figure 2:
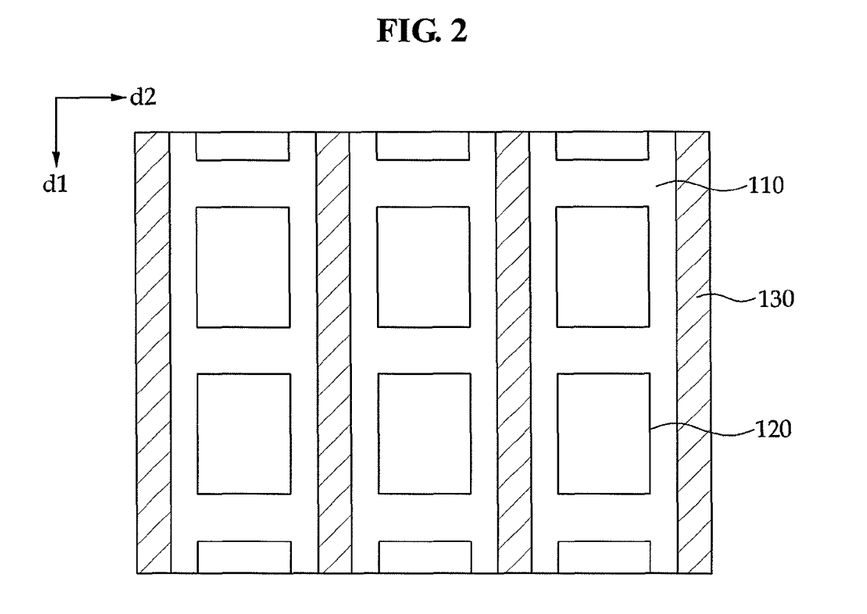
FIGS. 2 and 3 are diagrams schematically illustrating a configuration of an auxiliary electrode in an organic light emitting display device according to an embodiment of the present disclosure.
Figure 3:
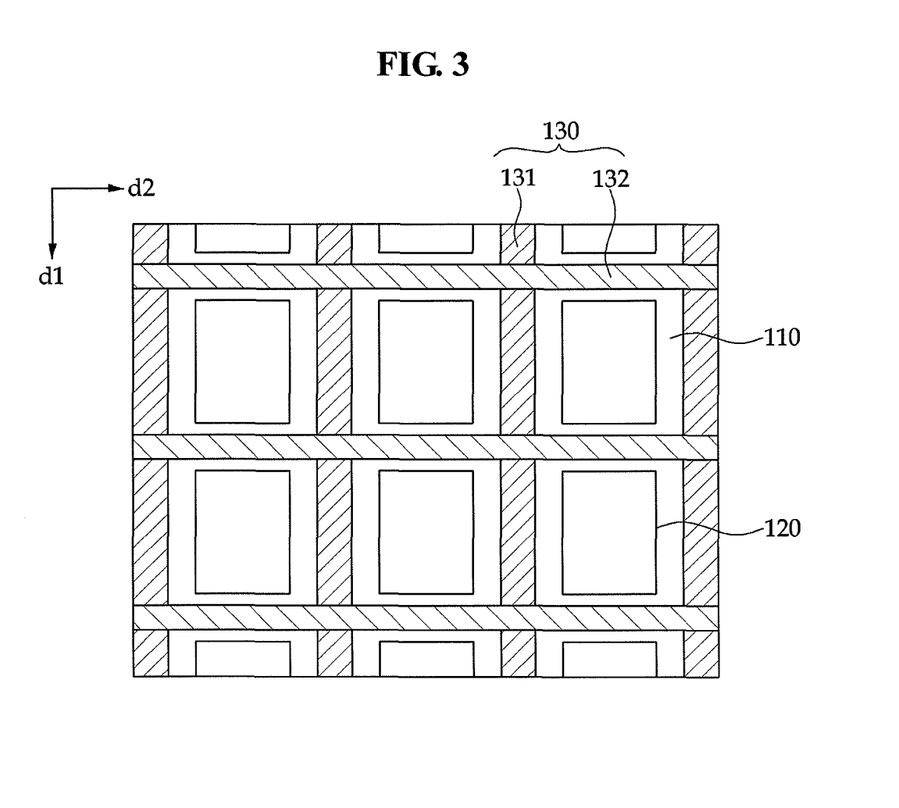
Figure 4:
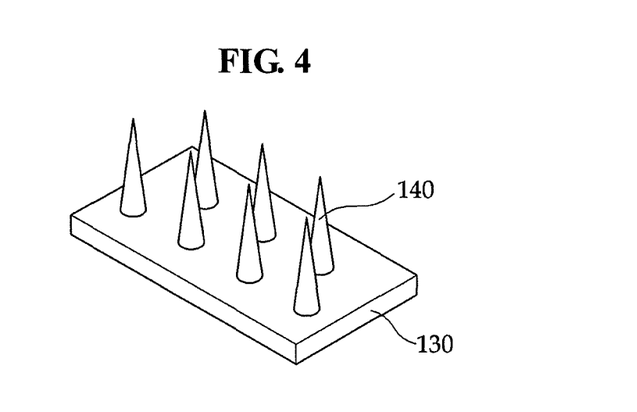
FIGS. 4 to 7 are diagrams illustrating a protrusion form in an organic light emitting display device according to an embodiment of the present disclosure.
Figure 5:
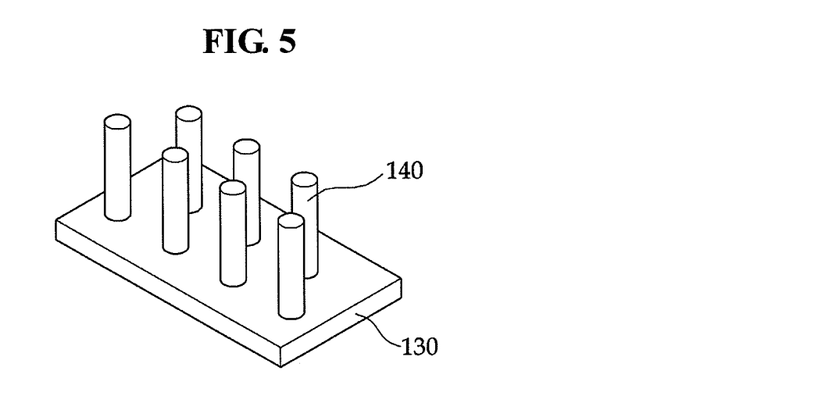
Figure 6:
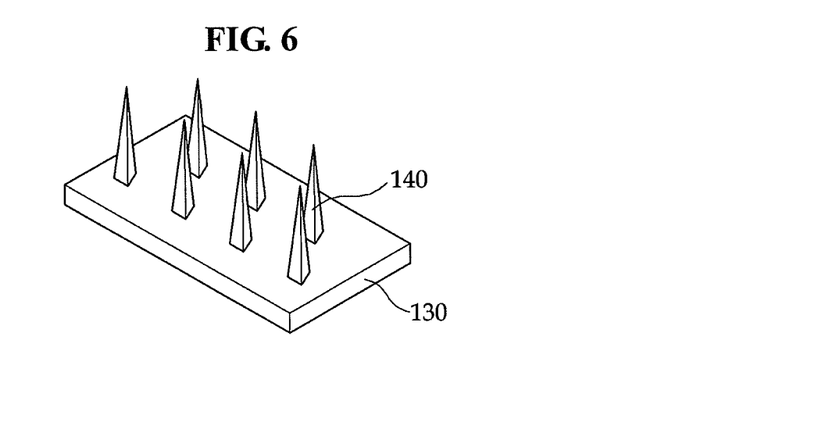
Figure 7:
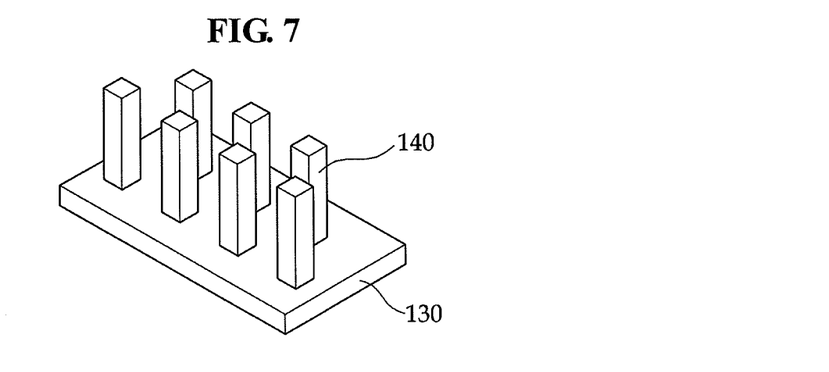

FIGS. 2 and 3 are plan views schematically illustrating a configuration of the auxiliary electrode 130 in the organic light emitting display device 100 according to an embodiment of the present disclosure.

Referring to FIGS. 2 and 3, the plurality of first electrodes 120 may be provided in a grid structure on the substrate 110, e.g., each first electrode 120 may include a plurality of segments spaced apart from each other along a first direction, e.g., d1 direction. For example, the first electrodes 120 may be spaced apart from each other along a second direction, e.g., d2 direction. For example, the plurality of segments of the plurality of first electrodes 120 may define a matrix pattern in the first and second directions. AS illustrated in FIG. 1, the auxiliary electrode 130 may be provided, e.g., directly, on a same element as the first electrodes 120, e.g., directly on the substrate 110, and may be spaced apart from the first electrodes 120 along a horizontal direction, i.e., a direction perpendicular to a normal to the substrate 110.

For example, referring to FIG. 2, the auxiliary electrode 130 may be provided between two first electrodes 120 adjacent to each other in the organic light emitting display device according to an embodiment of the present disclosure. For example, as illustrated in FIG. 2, the auxiliary electrode 130 according to an embodiment of the present disclosure may have a strip form extended in a first direction, i.e., along a d1 direction, between two first electrodes 120 adjacent to each other along a d2 direction. In another example, the auxiliary electrode 130 according to another embodiment of the present disclosure may have a strip form extended in a second direction, i.e., along the d2 direction, between two first electrodes 120 adjacent to each other along the d1 direction.

In another example, referring to FIG. 3, the organic light emitting display device according to an embodiment of the present disclosure may include a first auxiliary electrode 131 having a strip form extended in the first direction (d1) between two first electrodes 120 adjacent to each other, and a second auxiliary electrode 132 having a strip form extended in a second direction (d2) crossing the first direction (d1). For example, each one of the plurality of segments of the plurality of first electrodes 120 may be separated from an adjacent segment along the first and second direction by the second and first auxiliary electrodes 132 and 131, respectively.

It is noted that FIGS. 2 and 3 illustrate that the first direction (d1) and the second direction (d2) cross each other to form a grid. However, the first direction (d1) and the second direction (d2) are not limited thereto, and may be a diagonal direction according to a form of the first electrode 120.

Further, an end portion of the auxiliary electrode 130 having the strip form may include a voltage applying means (not shown) to apply voltage to the auxiliary electrode 130.

Referring back to FIG. 1, the protrusion 140 may be provided on the auxiliary electrode 130. The protrusion 140 may be formed of a conductive material in the organic light emitting display device 100 according to an embodiment of the present disclosure. The conductive material may include, e.g., indium tin oxide (ITO), gold (Au), silver (Ag), copper (Cu), aluminum (Al), molybdenum (Mo), tungsten (W), zinc oxide, tin oxide, indium oxide, and gallium oxide, and the like, which may be used alone or in combination with each other.

FIGS. 4 to 7 are diagrams illustrating shapes of the protrusion 140 in the organic light emitting display device 100 according to an embodiment of the present disclosure.

In the organic light emitting display device 100 according to an embodiment of the present disclosure, the protrusion 140 may have a variety of shapes. For example, the protrusion 140 may be provided to have a shape of a cone (FIG. 4), a cylinder (FIG. 5), a pyramid (FIG. 6), a prism (FIG. 7), etc. Further, the protrusion 140 may include a combination of shapes. It is noted that the shapes of the protrusion 140 illustrated in FIGS. 4 to 7 are mere examples, and are not restricted thereto.

A height of the protrusion 140, e.g., along a normal to the substrate 110, may be larger than a thickness of the organic layer 160, e.g., along a normal to the substrate 110, on the auxiliary electrode 130. Accordingly, the protrusion 140 may penetrate through the organic layer 160, and may electrically connect the auxiliary electrode 130 and the second electrode 170 through the organic layer 160, which is laminated on the auxiliary electrode 130.

For example, when the protrusion 140 has a sharp tip facing the organic layer 160, e.g., in a shape such as a cone or a pyramid, it is possible to prevent the organic layer 160 from being laminated onto an upper part of the protrusion 140. As such, during deposition of the organic layer 160 on the first electrodes 120 and the auxiliary electrodes 130, penetration of the protrusion 140 through the organic layer 160 may be facilitated. Therefore, physical and electrical contact between the protrusion 140 and the second electrode 170 may be ensured, so the protrusion 140 may be physically and electrically connected directly between the second electrode 170 and the auxiliary electrode 130.

Referring back to FIG. 1, the pixel defining layer 150 may be provided between the plurality of first electrodes 120, and between the first electrode 120 and the auxiliary electrode 130. The pixel defining layer 150 is formed of a conductive material, and may be provided to overlap end portions of the first electrode 120 and the auxiliary electrode 130.

The pixel defining layer 150 defines a sub-pixel area by dividing the first electrode 120 into a sub-pixel unit. In other words, an emitting region area and a non-emitting region area may be separated from each other in the organic light emitting display device 100 by the pixel defining layer 150. Further, the pixel defining layer 150 may electrically insulate the first electrode 120 from the auxiliary electrode 130.

The organic layer 160 may be provided on the first electrode 120 and the auxiliary electrode 130, which are separated by the pixel defining layer 150. The organic layer 160 may include an organic light emitting layer 163. The organic light emitting display device 100 according to an embodiment of the present disclosure may include a red light emitting layer, a green light emitting layer, and a blue light emitting layer as the organic light emitting layer 163. The organic light emitting display device 100 according to another embodiment of the present disclosure may further include a white light emitting layer as the organic light emitting layer 163.

A hole auxiliary layer 161 may be provided between the first electrode 120 and the organic light emitting layer 163. The hole auxiliary layer 161 may include a hole injection layer (HIL) and a hole transport layer (HTL). An electron auxiliary layer 165 may be provided between the organic light emitting layer 163 and the second electrode 170. The electron auxiliary layer 165 may include an electron transport layer (ETL) and an electron injection layer (EIL).

The organic layer 160 may be provided on the auxiliary electrode 130 separated by the pixel defining layer 150. The organic layer 160 on the auxiliary electrode 130 may include the hole auxiliary layer 161 and the electron auxiliary layer 165.

The second electrode 170 may be provided on the organic layer 160. As illustrated in FIG. 1, the second electrode 170 may be provided on, e.g., to overlap, the upper part of the organic light emitting layer 163, and may be extended to, e.g., overlap, an upper part of the pixel defining layer 150.

The second electrode 170 may be provided to be a transmissive electrode. The transmissive electrode may include at least one of, e.g., indium tin oxide, indium zinc oxide, zinc tin oxide, zinc oxide, tin oxide, gallium oxide, and the like, which may be used alone or in combination with each other.

In a top emission organic light emitting display device 100 according to an embodiment of the present disclosure, the second electrode 170 is provided to be a transmissive electrode, and may exhibit a high value of sheet resistance due to characteristics of its transmissivity.

In a conventional organic light emitting display device, a predetermined voltage may not be properly applied to a transmissive second electrode. In other words, a difference arises in the applied voltage between an area close to a portion applying voltage to the second electrode and another area far from the portion applying voltage to the second electrode. The larger the size of the organic light emitting display device 100, the greater the voltage difference.

However, according to the present disclosure, the auxiliary electrode 130 improves conductivity of the second electrode 170, as the auxiliary electrode 130 is electrically connected to the second electrode 170 via the protrusion 140. Accordingly, voltage difference in the second electrode 170 may be prevented.

Figure 8:
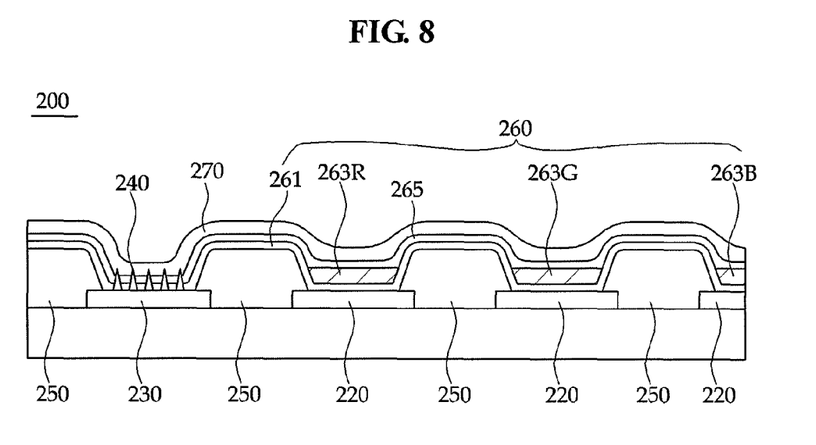
FIG. 8 is a cross-sectional view illustrating an organic light emitting display device according to another embodiment of the present disclosure.

FIG. 8 is a cross-sectional view illustrating an organic light emitting display device 200 according to another embodiment of the present disclosure. Duplicate description with respect to the organic light emitting display device 100 will be omitted.

Referring to FIG. 8, an organic light emitting display device 200 according to another embodiment of the present disclosure may include a substrate 210, a plurality of first electrodes 220 on the substrate 210, an auxiliary electrode 230 formed on the substrate 210 and spaced apart from the first electrode 220, a protrusion 240 on the auxiliary electrode 230, a pixel defining layer 250 overlapping end portions of the first electrode 220 and the auxiliary electrode 230 and separating the first electrode 220 from the auxiliary electrode 230, an organic layer 260 on the substrate 210 on which the first electrode 220, the auxiliary electrode 230, and the pixel defining layer 250 are formed, and a second electrode 270 on the organic layer 260.

According to an embodiment of the present disclosure, the auxiliary electrode 230 may be provided between the two first electrodes 220 adjacent to each other. With respect to the auxiliary electrode 230 according to an embodiment of the present disclosure, one auxiliary electrode may be provided for a single first electrode 220. With respect to the auxiliary electrode 230 according to another embodiment of the present disclosure, one auxiliary electrode may be provided for more than two first electrodes 220.

As illustrated in FIG. 8, with respect to the auxiliary electrode 230 of the organic light emitting display device according to an embodiment of the present disclosure, one auxiliary electrode 230 may be provided for one pixel. In this embodiment, the pixel includes at least two or more sub-pixels, and is the smallest element for color implementation.

FIG. 8 exemplifies that the pixel includes red, green, and blue sub-pixels, but the pixel in the organic light emitting display device 200 according to an embodiment of the present disclosure is not necessarily limited thereto. For example, the pixel may include red, green, blue, and white sub-pixels, or at least two or more sub-pixels among the red, green, blue, and white sub-pixels may be combined with each other to form the pixel.

Figure 9:
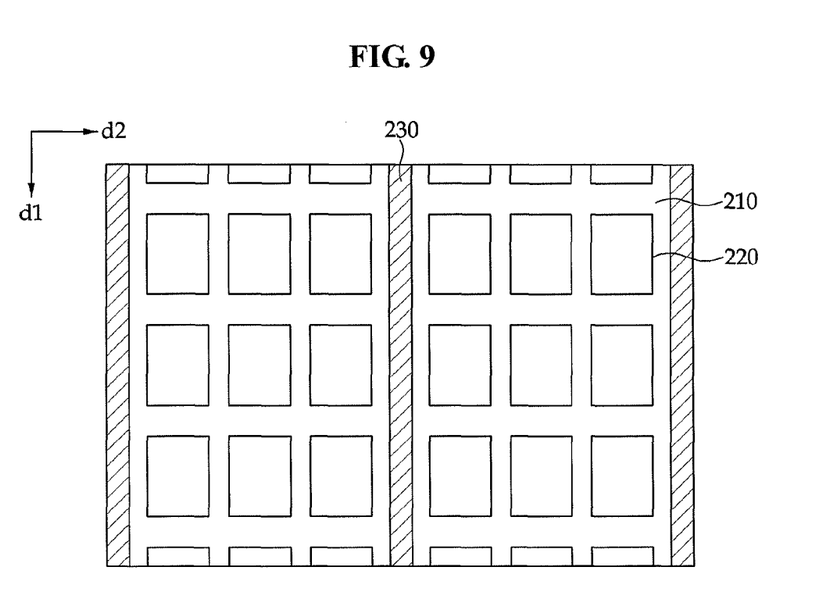
FIGS. 9 and 10 are diagrams schematically illustrating a configuration of an auxiliary electrode in an organic light emitting display device according to another embodiment of the present disclosure.
Figure 10:
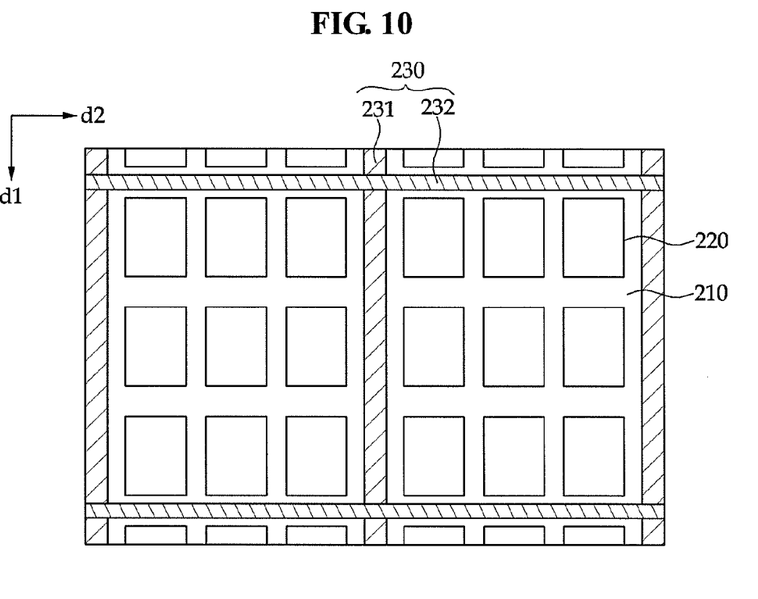

FIGS. 9 and 10 are diagrams schematically illustrating a configuration of the auxiliary electrode 230 in an organic light emitting display device 200 according to another embodiment of the present disclosure.

Referring to FIGS. 9 and 10, the organic light emitting display device 200 according to an embodiment of the present disclosure may include the plurality of first electrodes 220 provided to have a grid structure on the substrate 210 and the auxiliary electrode 230 provided to be spaced apart from the first electrode 220.

Referring to FIG. 9, in the organic light emitting display device 200 according to an embodiment of the present disclosure, the auxiliary electrode 230 may be provided between the two pixels adjacent to each other. For example, as illustrated in FIG. 9, the auxiliary electrode 230 may have a strip form extending in the first direction (d1) between two pixels adjacent to each other along the second direction (d2). In another example, the auxiliary electrode 230 may have a strip form extending in the second direction (d2) between two pixels adjacent to each other along the first direction (d1).

Referring to FIG. 10, the organic light emitting display device 200 according to an embodiment of the present disclosure may include a first auxiliary electrode 231 having a strip form extending in the first direction (d1) between the two pixels adjacent to each other and a second auxiliary electrode 232 having a strip form extending in the second direction (d2) crossing the first direction (d1).

FIGS. 9 and 10 exemplify that the first direction (d1) and the second direction (d2) cross each other to form a grid. However, the first direction (d1) and the second direction (d2) are not limited thereto, and may be a diagonal direction according to an area form of the pixel.

Further, an end portion of the auxiliary electrode 230 having a strip form illustrated in FIGS. 9 and 10 may include a voltage applying means (not shown) to apply voltage to the auxiliary electrode 230.

Referring back to FIG. 8, the organic layer 260 may be provided on the first electrode 220 and the auxiliary electrode 230 separated by the pixel defining layer 250. The organic layer 260 may include an organic light emitting layer 263R, 263G, 263B. The organic light emitting layer 263R, 263G, 263B may include a red light emitting layer 263R, a green light emitting layer 263G, and a blue light emitting layer 263B.

A hole auxiliary layer 261 may be provided between the first electrode 220 and the organic light emitting layer 263R, 263G, 263B. The hole auxiliary layer 261 may include a hole injection layer (HIL) and a hole transport layer (HTL). An electron auxiliary layer 265 may be provided between the organic light emitting layer 263R, 263G, 263B and the second electrode 270. The electron auxiliary layer 265 may include an electron transport layer (ETL) and an electron injection layer (EIL).

The organic layer 260 may be provided on the auxiliary electrode 230 separated by the pixel defining layer 250. The organic layer 260 on the auxiliary electrode 230 may include the hole auxiliary layer 261 and the electron auxiliary layer 265.

In a top emission organic light emitting display device 200 according to another embodiment of the present disclosure, the second electrode 270 is provided to be a transmissive electrode, and may exhibit a high value of sheet resistance due to characteristics of the transmissive electrode.

In a conventional organic light emitting display device, a predetermined voltage may not be properly applied to a transmissive second electrode. In other words, a difference arises in the applied voltage between an area close to a portion applying voltage to the second electrode and another area far from the portion applying voltage to the second electrode. The larger the size of the organic light emitting display device 100, the greater the voltage difference.

However, according to the present disclosure, the auxiliary electrode 230 is provided to improve conductivity of the second electrode 270, as the auxiliary electrode 230 is electrically connected to the second electrode 270 by using the protrusion 240. Therefore, the voltage difference in the second electrode 270 may be prevented or substantially minimized.

FIGS. 11A to 11E are diagrams illustrating stages in a manufacturing method of an organic light emitting display device according to an embodiment of the present disclosure.

An embodiment of the present disclosure provides a manufacturing method of the organic light emitting display device. In detail, the manufacturing method may include forming the first electrode 120 and the auxiliary electrode 130 on the substrate 110 (see FIG. 11A), forming the protrusion 140 on the auxiliary electrode 130 (see FIG. 11B), forming the pixel defining layer 150 between the first electrode 120 and the auxiliary electrode 130 to overlap end portions of the first electrode 120 and the auxiliary electrode 130 (see FIG. 11C), forming an organic layer 160 on the substrate 110 whereon the first electrode 120, the auxiliary electrode 130, and the pixel defining layer 150 are formed (see FIG. 11D), and forming a second electrode 170 on the organic layer 160 (see FIG. 11E).

Figure 11A:
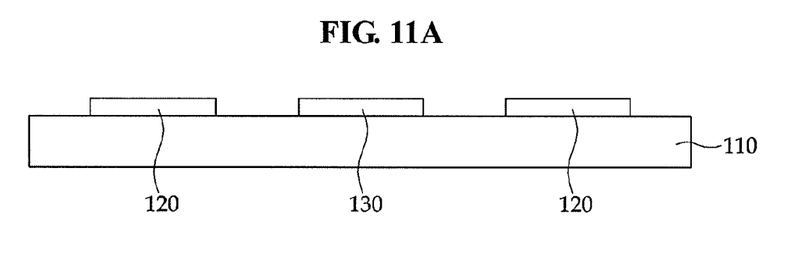
FIGS. 11A to 11E are diagrams illustrating a manufacturing method of an organic light emitting display device according to an embodiment of the present disclosure.

Referring to FIG. 11A, the first electrode 120 and the auxiliary electrode 130 may be formed on the substrate 110. According to an embodiment, the first electrode 120 and the auxiliary electrode 130 may be formed by forming a material layer (not shown in the drawing) to form a first electrode and an auxiliary electrode on the substrate 110, and patterning the material to form the first electrode 120 and the auxiliary electrode 130. The first electrode 120 and the auxiliary electrode 130 may be formed by using the same material or may be formed of different materials.

Figure 11B:
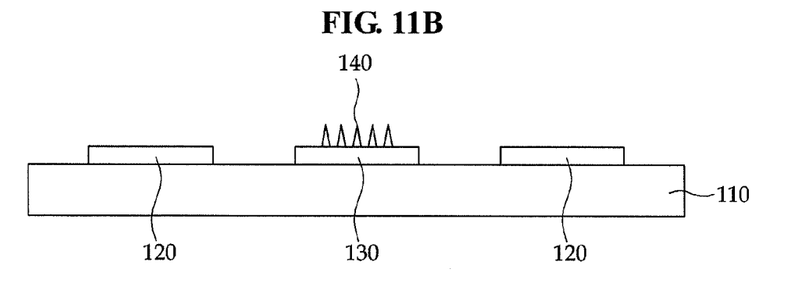

Referring to FIG. 11B, the protrusion 140 may be formed on the auxiliary electrode 130. According to an embodiment of the present disclosure, forming the protrusion 140 may include forming a protrusion-forming material layer (not shown in the drawing) on the substrate 110, on which the first electrode 120 and the auxiliary electrode 130 are patterned, and leaving the protrusion 140 only on the auxiliary electrode 130 by patterning the formed protrusion-forming material layer.

Forming the protrusion-forming material layer may include, e.g., a sputtering process, a vacuum deposition process, a chemical vapor deposition (CVD) process, a pulsed laser deposition process, a printing process, an atomic layer deposition (ALD) process, and the like. Forming the protrusion-forming material layer may include forming the protrusion 140 in any suitable shape by adjusting, e.g., temperature, time, pressure, and the like, during formation. In order to form the protrusion 140 only on the auxiliary electrode 130, a photolithography process may be used.

Figure 11C:
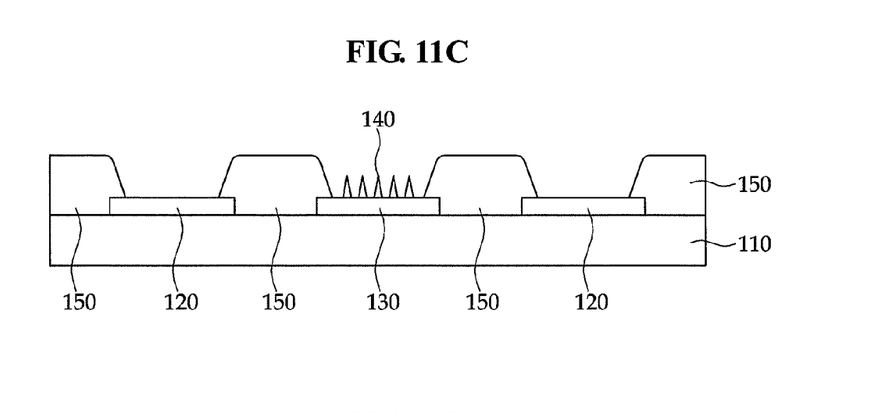

Referring to FIG. 11C, the pixel defining layer 150 may be formed between the first electrode 120 and the auxiliary electrode 130 including the protrusion 140. The pixel defining layer 150 may be formed by using an organic material or an inorganic material. For example, the pixel defining layer 150 are formed of an organic material, such as photoresist, polyacrylic resin, polyimide resin, acrylic resin, and the like, or may include an inorganic material, such as a silicone compound. The pixel defining layer 150 may be formed by forming a pixel defining layer-forming material layer (not shown in the drawing) on the substrate 110, whereon the first electrode 120 and the auxiliary electrode 130 including the protrusion 140 are formed, and by partially etching the pixel defining layer-forming material layer.

Figure 11D:
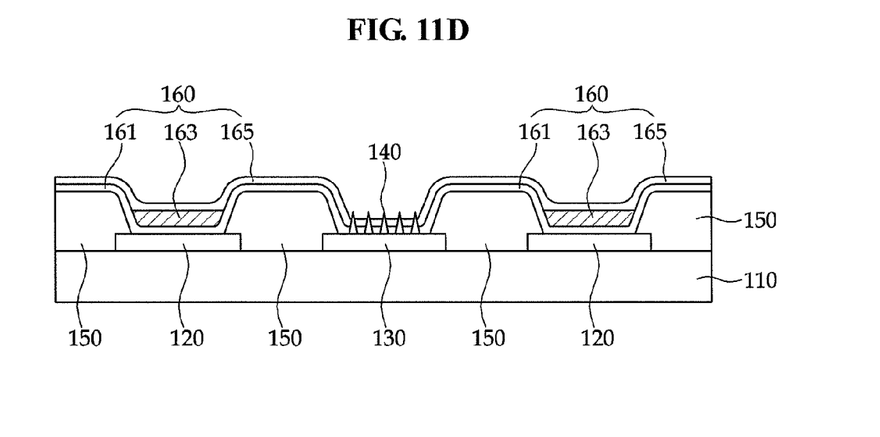

Referring to FIG. 11D, the organic layer 160 may be formed on the substrate 110, on which the first electrode 120, the auxiliary electrode 130, and the pixel defining layer 150 are formed. The organic layer 160 on the first electrode 120 may have a multilayer structure including the hole auxiliary layer 161, the organic light emitting layer 163, and the electron auxiliary layer 165. As the hole auxiliary layer 161, the hole injection layer (HIL) and the hole transport layer (HTL) may be formed. As the electron auxiliary layer 165, the electron transport layer (ETL) and the electron injection layer (EIL) may be formed.

According to an embodiment, the organic light emitting layer 163 may include at least one of a red light emitting layer, a green light emitting layer, and a blue light emitting layer. According to another embodiment, the organic light emitting layer 163 may further include a white light emitting layer.

An organic layer 160 on the auxiliary electrode 130 may include the hole auxiliary layer 161 and the electron auxiliary layer 165. In the organic light emitting display device according to an embodiment of the present disclosure, the organic layer 160 is formed after the auxiliary electrode 130 and the protrusion 140 are formed, and thus damage to the organic layer 160 may be prevented in the manufacturing process.

Figure 11E:
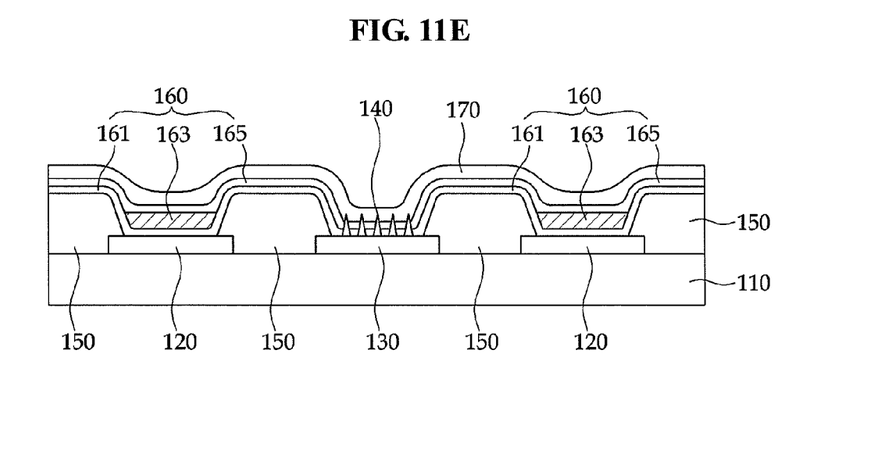

Referring to FIG. 11E, the second electrode 170 may be formed on the organic layer 160. According to an embodiment of the present disclosure, the second electrode 170 may be formed only on an upper part of the organic layer 160, or as illustrated in FIG. 11E, the second electrode 170 may be formed on the upper part of the organic layer 160 and may extend to an upper part of the pixel defining layer 150.

According to an embodiment, a top emission organic light emitting display device may include an auxiliary electrode electrically connected to a transmissive electron injection electrode, so the sheet resistance of the electron injection electrode may be reduced. Further, since the auxiliary electrode and the electron injection electrode are electrically and physically connected to each other without any additional process, the manufacturing process may be simplified. In addition, as the organic layer is formed after the auxiliary electrode and a protrusion are formed, damage to the organic layer may be minimized during the manufacturing process.

In contrast, a conventional top emission organic light emitting display device includes a transmissive electron injection electrode with a high sheet resistance. However, the increased sheet resistance may cause non uniform voltage application to the electron injection electrode. In other words, a difference arises in the applied voltage between a region of the electron injection electrode close to a portion applying voltage to the electron injection electrode and a region of the electron injection electrode far from a portion applying voltage to the electron injection electrode.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting display device, comprising:
   a first electrode on a substrate;
   an auxiliary electrode on the substrate, the auxiliary electrode being spaced apart from the first electrode;
   a protrusion on the auxiliary electrode;
   a pixel defining layer overlapping end portions of the first electrode and of the auxiliary electrode, the pixel defining layer separating the first electrode from the auxiliary electrode;
   an organic layer on the first electrode; and
   a second electrode on the organic layer, the protrusion electrically connecting the second electrode to the auxiliary electrode.

2. The organic light emitting display device as claimed in claim 1, wherein the auxiliary electrode is between adjacent first electrodes.

3. The organic light emitting display device as claimed in claim 2, wherein the auxiliary electrode has a strip pattern extending in a first direction.

4. The organic light emitting display device as claimed in claim 3, further comprising an additional auxiliary electrode having a strip pattern extending in a second direction intersecting the first direction.

5. The organic light emitting display device as claimed in claim 1, wherein the organic layer overlaps the auxiliary electrode, a height of the protrusion on the auxiliary electrode being greater than a thickness of the organic layer on the auxiliary electrode.

6. The organic light emitting display device as claimed in claim 1, wherein the protrusion has a shape of a cone, a cylinder, a pyramid, and/or a prism.

7. The organic light emitting display device as claimed in claim 1, wherein the protrusion is conductive.

8. The organic light emitting display device as claimed in claim 1, wherein the protrusion includes at least one of indium tin oxide (ITO), gold (Au), silver (Ag), copper (Cu), aluminum (Al), molybdenum (Mo), tungsten (W), zinc oxide, tin oxide, indium oxide, and gallium oxide.

9. The organic light emitting display device as claimed in claim 1, wherein the organic layer includes an organic light emitting layer.

10. The organic light emitting display device as claimed in claim 9, wherein the organic light emitting layer includes a red light emitting layer, a green light emitting layer, and/or a blue light emitting layer.

11. The organic light emitting display device as claimed in claim 10, wherein the organic light emitting layer further comprises a white light emitting layer.

12. The organic light emitting display device as claimed in claim 9, further comprising a hole transport layer and a hole injection layer between the first electrode and the organic light emitting layer.

13. The organic light emitting display device as claimed in claim 9, further comprising an electron transport layer and an electron injection layer between the organic light emitting layer and the second electrode.

14. A manufacturing method of an organic light emitting display device, the method comprising:
    forming a first electrode and an auxiliary electrode on a substrate, the auxiliary electrode being spaced apart from the first electrode;
    forming a protrusion on the auxiliary electrode;
    forming a pixel defining layer overlapping end portions of the first electrode and of the auxiliary electrode, the pixel defining layer separating the first electrode from the auxiliary electrode;
    forming an organic layer on the first electrode; and
    forming a second electrode on the organic layer, the protrusion electrically connecting the second electrode to the auxiliary electrode.

15. The manufacturing method of the organic light emitting display device of claim 14, wherein forming the protrusion on the auxiliary electrode includes:
    forming a protrusion-forming material on the substrate, on which the first electrode and the auxiliary electrode are formed; and
    patterning the protrusion-forming material, such that the protrusion are only on the auxiliary electrode.

16. The manufacturing method of the organic light emitting display device as claimed in claim 15, wherein forming the protrusion-forming material includes a sputtering process or a chemical vapor deposition (CVD) process.

* * * * *